(12) United States Patent
Sieben

(10) Patent No.: US 7,742,267 B2
(45) Date of Patent: Jun. 22, 2010

(54) CIRCUIT ARRANGEMENT AND METHOD FOR DETECTING THE STATE OF A CIRCUIT PROTECTION ELEMENT

(75) Inventor: Bernhard Sieben, Neuried (DE)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 287 days.

(21) Appl. No.: 11/794,079

(22) PCT Filed: Nov. 28, 2005

(86) PCT No.: PCT/EP2005/056283

§ 371 (c)(1),
(2), (4) Date: Mar. 6, 2008

(87) PCT Pub. No.: WO2006/067024

PCT Pub. Date: Jun. 29, 2006

(65) Prior Publication Data

US 2009/0021876 A1    Jan. 22, 2009

(30) Foreign Application Priority Data

Dec. 22, 2004  (DE) ................. 10 2004 061 909

(51) Int. Cl.
*H02H 7/00* (2006.01)
(52) U.S. Cl. .......................... 361/78; 361/18
(58) Field of Classification Search .................. 361/18, 361/78, 93.9
See application file for complete search history.

(56) References Cited

U.S. PATENT DOCUMENTS 6,490,141 B2 * 12/2002 Fischer et al. ................. 361/66
6,628,485 B1 * 9/2003 Rajala et al. .................. 361/31
2004/0246644 A1  12/2004 Sato et al.

FOREIGN PATENT DOCUMENTS

DE   89 13 708 U1   1/1990
EP   0449262        10/1991

* cited by examiner

*Primary Examiner*—Danny Nguyen
(74) *Attorney, Agent, or Firm*—Laurence A. Greenberg; Werner H. Stemer; Ralph e. Locher

(57) ABSTRACT

There is described circuit arrangement which comprises a protection element. A state of the protection element is determined in a simple and safe manner by means of a detection unit and a specification unit, in addition to an evaluation unit.

20 Claims, 3 Drawing Sheets

Figure 1:
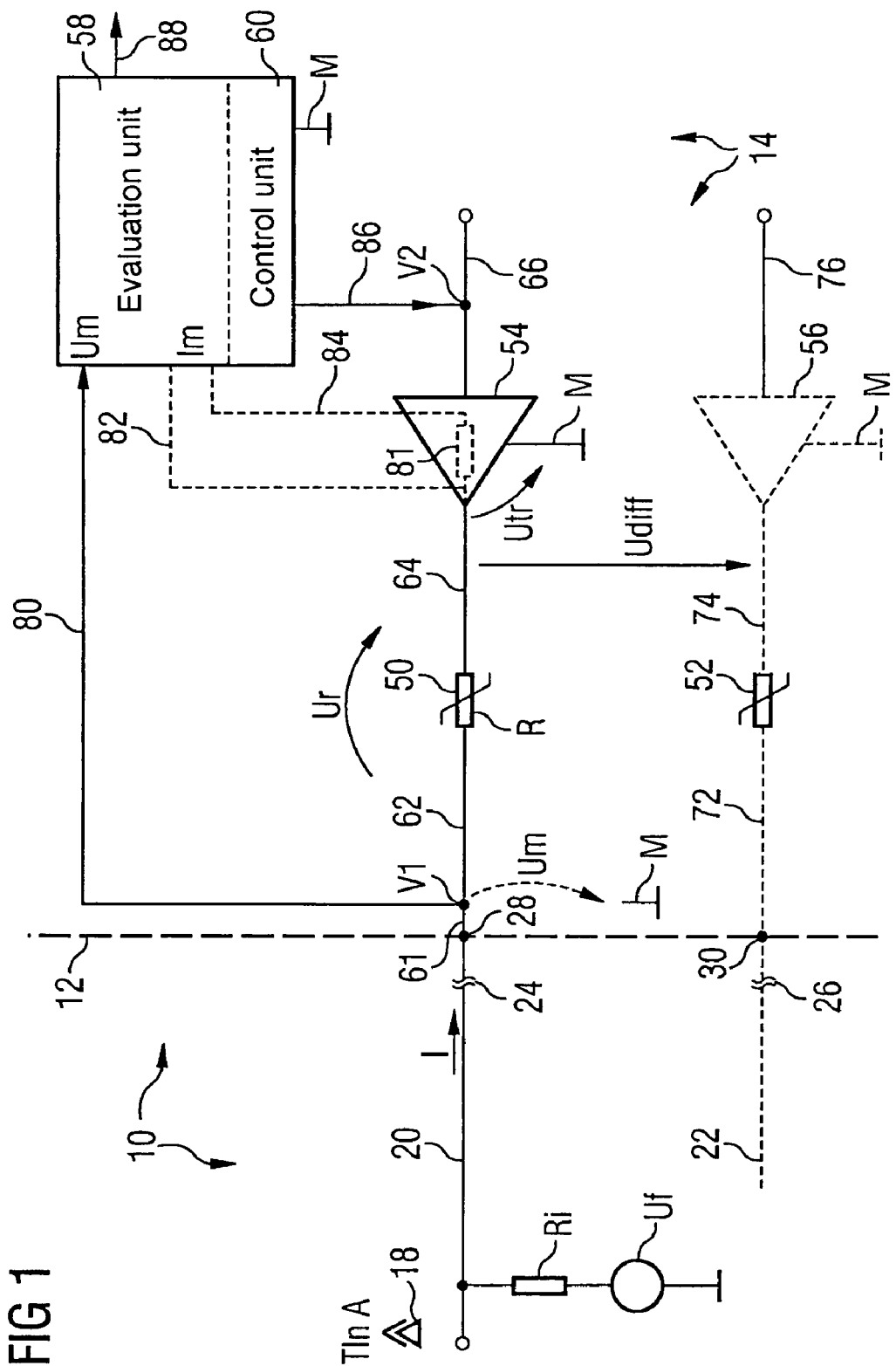

CIRCUIT ARRANGEMENT AND METHOD FOR DETECTING THE STATE OF A CIRCUIT PROTECTION ELEMENT

The invention relates, inter alia, to a circuit arrangement with a protection element, the ohmic resistance of which is dependent upon the flow of current through said protection element. In one voltage range, the flow of current through the protection element and the voltage on the protection element change in synchronism with one another. In another voltage range, however, the flow of current and the voltage change in opposite directions to one another. In other words the protection element has a characteristic curve which has a positive differential resistance in one voltage range and a negative differential resistance in another voltage range. An example of one such protection element is a PTC (positive temperature coefficient) resistor.

Such protection elements are used for the protection of circuits, for example together with thyristors in subscriber line circuits, with the aid of which subscriber terminals are connected to a telecommunications network, in particular to a through-connected telecommunications network. If, for example, the subscriber line circuit is also used as a testing circuit for testing the subscriber line or the subscriber terminal, then the protection element may falsify the measurement because of its non-linear characteristic curve, particularly if the current operating status of the protection element is not precisely known. Similar problems also occur in other fields of technology.

The object of the invention is to provide a simply constructed circuit arrangement for detecting the state of the protection element. In particular, the circuit arrangement is intended to facilitate safe detection in many different types of malfunction in which the protection element protects the circuit arrangement. In particular, the circuit arrangement should also, in particular, facilitate safe detection if the detection of the state is impeded by many large tolerances. A method for detecting the state of the circuit protection element is provided in addition.

The object relating to the circuit arrangement is fulfilled by a circuit arrangement having the units specified in claim 1. Developments are specified in the subclaims.

In the inventive circuit arrangement the differential resistance or the sign of the differential resistance of the protection element is determined, e.g. of a PTC resistor (positive temperature coefficient), i.e. of a so-called thermistor. This enables an accurate statement to be made concerning the state of the protection element. If the differential resistance of the protection element is positive, then the protection element, for example a PTC, is low-resistance. If, however, the differential resistance is negative, then the protection element is high-resistance. In this method it is not necessary for the precise value of the differential resistance to be determined. The method is therefore robust with regard to detection tolerances, and particularly robust with regard to measurement tolerances. Furthermore, the procedure is robust with regard to temperature fluctuations, which likewise affect the value of the resistance of the protection element. The method is furthermore robust with regard to protection elements, of which the nominal resistance value, at a given current and a given temperature, fluctuates greatly around a mean value, for example in a range greater than +10 percent to lower than −10 percent, in particular in the range from +15 percent to −15 percent.

The inventive circuit arrangement contains, in addition to the protection element, at least one detection unit, which detects at least one potential on the protection element or one current flowing through said protection element. The circuit arrangement furthermore contains at least one specification unit, which carries out at least one modification to the potential on the protection element or one modification to the current through the protection element. The circuit arrangement also contains an evaluation unit, which is connected on the input side to an output of the detection unit and which, depending on an output signal or a piece of output data from the detection unit, and depending on at least one modification initiated by the specification unit, generates an output signal or a piece of output data, which specifies whether the voltage and current on the protection element are synchronous or moving in opposite directions. The circuit arrangement enables the state to be safely detected even if the current or voltage is detected only with a tolerance of greater than 1 percent. For example, the absolute tolerances in voltage measurement are greater than 1 milliampere or greater than 2 milliamperes. The specification of a current or of a voltage is, for example, likewise carried out with tolerances greater than 1 percent or even greater than 2 percent.

For example, the absolute tolerances in a voltage specification are in the range of up to 2 volts. Even ambient temperature fluctuations in a range from 15 degrees Celsius to 25 degrees Celsius or even in a range from 25 degrees Celsius to 80 degrees Celsius do not affect the detection accuracy of the circuit arrangement.

The inventive circuit arrangement makes it possible, in particular, for a current measurement also to be carried out in the event of an external voltage on the subscriber line from a subscriber line circuit, in order to assess the current-carrying capacity of the external voltage source and thus its hazardousness to persons. If the protection element is high-resistance, because the source delivered a current that is above the so-called breakover current of the protection element, the protection element reduces the current measurable with the aid of the line port or the line circuit, sometimes by several orders of magnitude. Since it can be safely established that the protection element is high-resistance, the measured current value may be corrected upward so that accurate statements as to the hazardousness of the external voltage source are possible. Thus special measures for the protection of persons are only initiated if they are actually necessary. So-called "false alarms" then occur only rarely or not at all.

In a development of the inventive circuit arrangement, said circuit arrangement contains a line or a connection unit for a line, which has a length of more than 50 meters or more than 500 meters. The circuit arrangement contains in particular a line to which a subscriber terminal of a telecommunications network is also connected. The connection unit is, for example, a plug, a jack, a soldering pin or part of a clamp connection. Subscriber lines, due to their length, are vulnerable to the effects of external voltage, for example in a contact to parallel-laid lines of a power supply network.

In a subsequent development of the inventive circuit arrangement the detection unit also contains a line driver or a component of a line driver. The line driver contains in particular a push-pull output stage or enables the voltage to be amplified more than 10 fold. Line drivers have low output resistances, which in particular are lower than 100 ohms and thus facilitate low-loss connection to a line.

In another development of the circuit arrangement the specification unit also contains a line driver or a component of a line driver. As a result of this measure the line driver has multiple use, so that the cost for the circuit arrangement is low.

In a subsequent development the specification unit initiates at least two modifications. Even though one modification would be sufficient to detect the state of the protection element, if there are two modifications it is possible for the detection accuracy to be increased with appropriate selection of the specifications. For example, two direct voltages with signs that differ from one another are selected. Currents with different signs can likewise be fed in. Instead of a direct voltage or a direct current, however, an alternating voltage or alternating current may also be used. In this case, for example with the aid of a multiplier, the phase relation between current and voltage and thus the sign of the differential resistance, can easily be detected.

In a subsequent development of the circuit arrangement, said circuit arrangement contains:
a voltage detection unit,
a current detection unit, and
a voltage specification unit.

In such a circuit arrangement, a particularly large number of units already existing in a subscriber circuit may be used for detecting the state of the protection element. Furthermore, in addition to determining the sign of the differential resistance, it is also possible for the value of the differential resistance to be determined, in order thus to increase the detection accuracy.

In a subsequent development the voltage detection unit detects the voltage on a connection of the protection element to ground. This measurement means that the voltage does not need to be detected via the protection element itself. In addition, the differential resistance or the sign of the differential resistance can be detected without the need for a common-mode voltage of the line driver to be known.

In another development of the inventive circuit arrangement the protection element is a PTC resistor, a so-called polyswitch or another protection element, which has the characteristic curve mentioned in the introduction. Said protection elements have a resistor that is highly temperature-dependent, so that particularly high demands are placed on the accurate detection of the operating state of the protection element.

In a subsequent development the circuit arrangement contains a control unit, which is connected on the output side to the specification unit and the evaluation unit and therefore controls their mode of operation. The control unit contains, for example, a processor that executes program instructions stored in a memory. In one alternative, however, the control circuit does not contain a processor.

The invention relates in addition to methods for detecting the state of a protection element, in particular using the inventive circuit arrangement or one of the developments thereof. Thus the aforementioned technical effects also apply to the methods. The methods may be carried out easily and with high detection accuracy.

Figure 2:
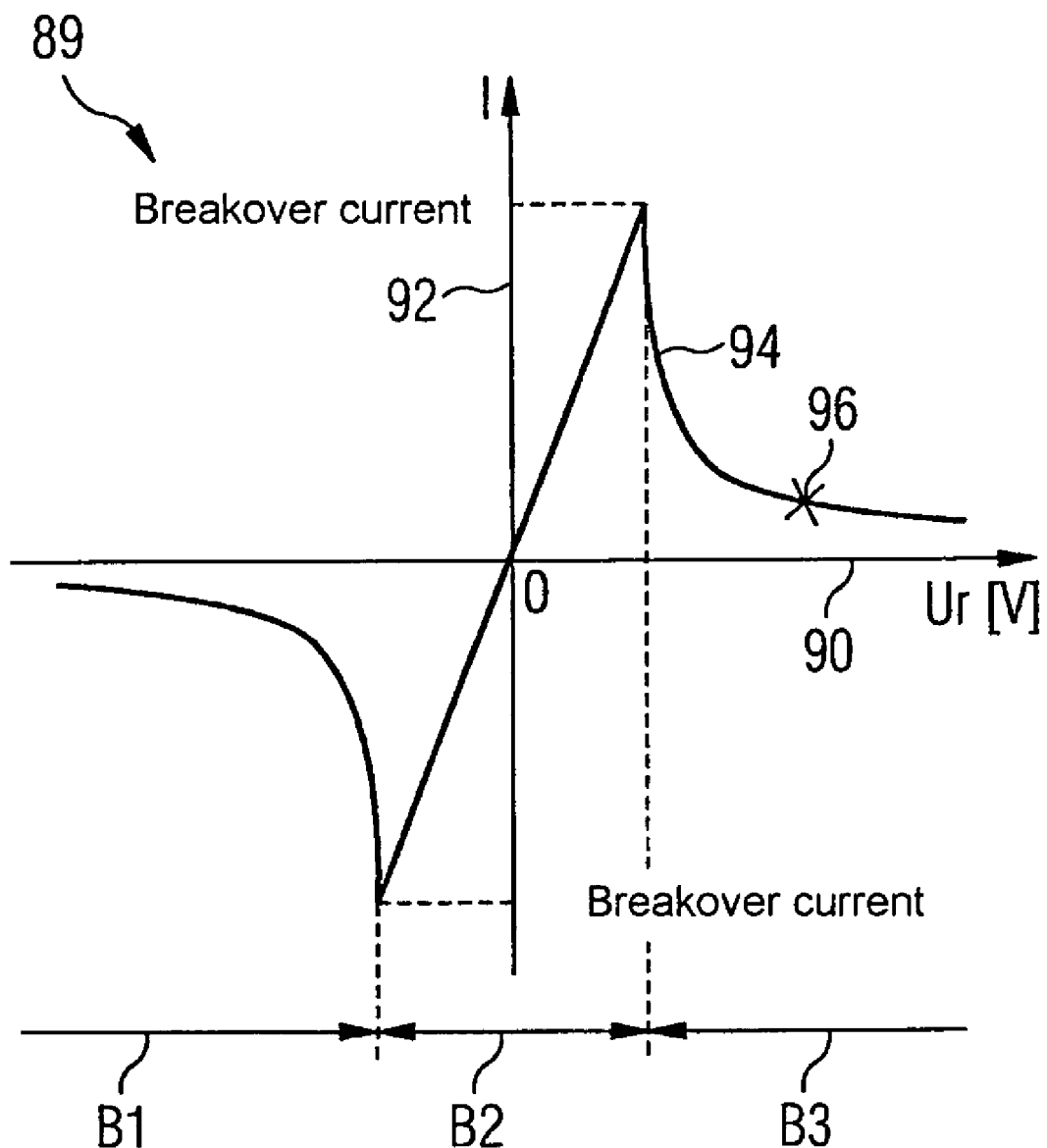
Figure 3:
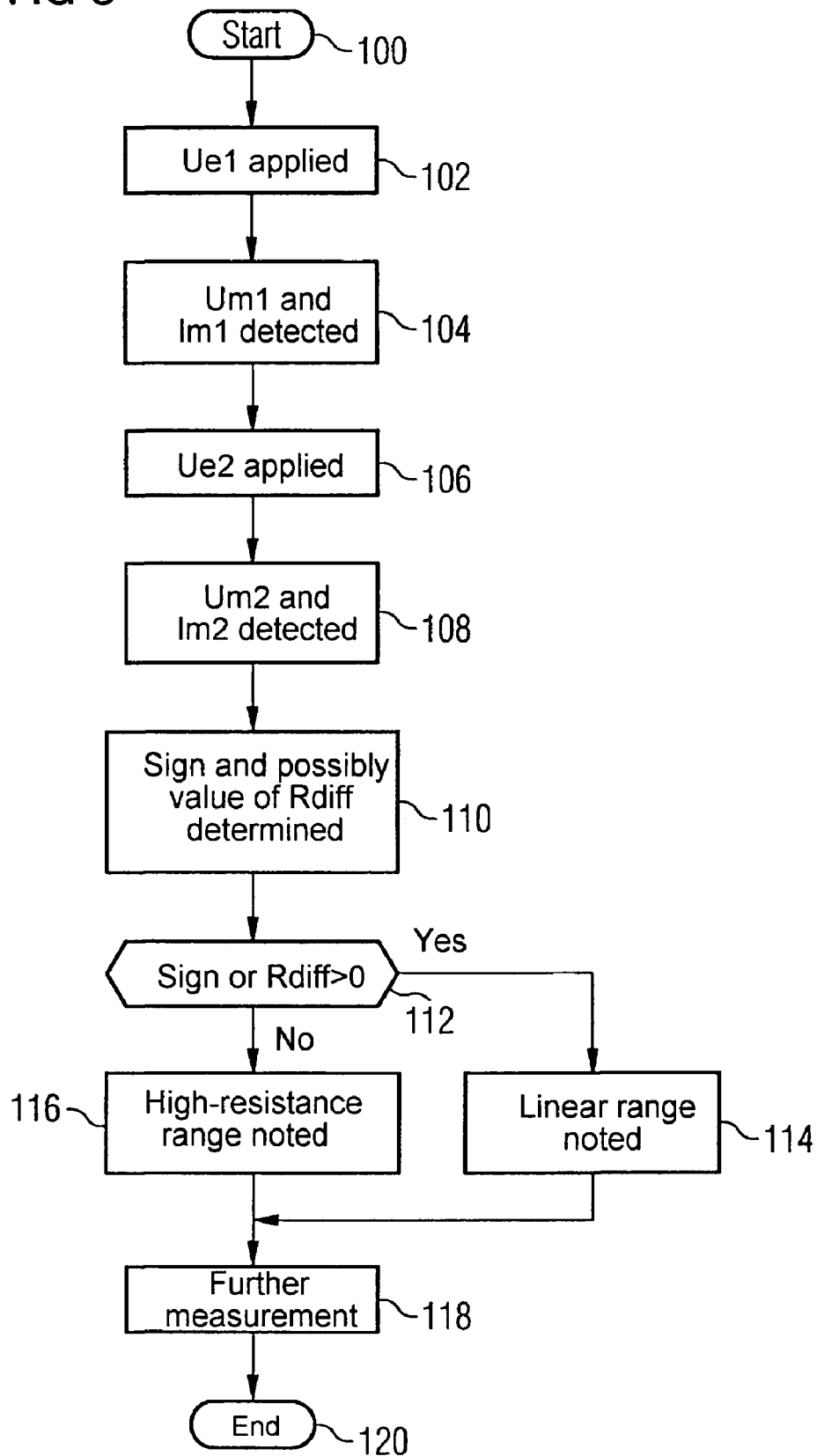

Exemplary embodiments of the invention are explained below with the aid of the accompanying drawings. In these,
FIG. 1 shows a subscriber line circuit arrangement,
FIG. 2 shows a characteristic curve of a PTC, and
FIG. 3 shows method steps for determining the state of a PTC.

FIG. 1 shows a subscriber line circuit arrangement 10 which contains, to the right of a vertical dashed line 12, a network-side line circuit 14, also known as a SLIC (subscriber line interface circuit). To the left of the dashed line 12 is a two-wire line, which leads to a telephone 18 of a subscriber TlnA. The two-wire line contains a wire 20 and a wire 22, which—for example—are each over 1 km in length. In a malfunction, an external voltage Uf is applied to the wire 20. An external voltage source generating the external voltage Uf may, for example, be an alternating voltage source or a direct voltage source. The external voltage source has an internal resistor Ri. Wavy lines 24, 26 indicate the greatly truncated illustration of the two-wire line in FIG. 1. The wire 20 is connected to a terminal 28 on the line circuit 14. The wire 22 is connected to a terminal 30. For example, the terminals 28 and 30 are jacks or plugs in a plug connection. Clamps or solder connections may be used alternatively.

The line circuit 14 contains:
two PTC resistors 50, 52,
two line drivers 54, 56,
an evaluation unit 58,
a control unit 60, and
an evaluation unit 58.

The characteristic curves of the PTC resistors 50, 52 are explained in greater detail below with the aid of FIG. 2.

The line drivers 54 and 56 are, for example, components of a push-pull output stage, which has two outputs, between which a differential voltage Udiff is generated. A driver voltage Utr is present from the driver output of the line driver 54 to ground M.

The functions of the evaluation unit 58 and of the control unit 60 are fulfilled, by way of example, with the aid of a processor, wherein the evaluation unit or the control unit also contain analog to digital or digital to analog converters. The functions of the evaluation unit 58 and of the control unit 60 are also clearly visible in the explanation of the method steps shown in FIG. 3.

A connection 61 leads from the terminal 28 to a branch V1. An electrically conductive connection 62 leads from the branch V1 to the one terminal of the PTC resistor 50. A connection 64 leads from the other terminal of the PTC resistor 50 to the output of the line driver 54. A connection 72 further leads from the terminal 30 to a terminal of the PTC resistor 52. A connection 74 leads from a different terminal in the PTC resistor 52 to the output of the line driver 56. A connection 66, which contains a branch V2, leads to the input of the line driver 54. A connection 76 leads to the input of the line driver 56.

An electrically conductive connection 80 leads from the branch V1 to an input of the evaluation unit 58. The connection 80 is used for transferring a measurement voltage Um, which is measured to ground M.

The line driver 54 contains, for measuring voltage, a precision resistor 81, via which—with the aid of two measurement connections 82, 84—a measurement voltage may be picked up, which is converted, via the known resistance value R of the precision resistor 81, into a measurement current Im. The precision resistor 81 is used both for detecting the state of the PTC resistor 50 as explained below and also for other measurement and testing purposes.

A connection 86 leads from an output of the control unit 60 to the branch V2. The connection 86 is used for specifying the voltages in the context of the detection of the differential resistance of the PTC resistor 50 as explained below. A connection 88 is used for outputting a resulting signal or piece of resulting data through the evaluation unit 58. The connections 61 to 88 are, for example, conductor paths on a printed circuit board.

In the circuit arrangement shown with the aid of FIG. 1 there are thyristors connected to the connection 64 and/or 74, which are connected to ground. The control input of the thyristors is connected respectively via a diode either with the positive operating voltage or with a negative operating voltage. In other exemplary embodiments the current measurement is carried out, for example, between the external voltage source and the PTC resistor 50 in the line circuit 14.

A voltage Ur is present across the PTC resistor 50. The telephone 18 represents the load, which is driven by the differential voltage Udiff output by the line drivers 54, 56. The voltage of the common-mode section on the output of the line driver 54 or 56 to ground M is insignificant for normal operation on the load. The precise value of this voltage may be unknown, for example if the line driver 54, 56 is operated on a voltage supply the voltage of which is subject to considerable fluctuations dependent upon the connected load. In addition, in a battery-supported power supply unit, there is also a time dependency owing to the continuous discharging of the battery.

The following voltage equation applies for the line driver 54:

$$Utr = U(equal) + Udiff/2,$$

wherein U(equal) is the voltage of the common-mode section of the line driver 54 measured to ground M.

On the other hand, the voltage equation:

$$Utr = U(equal) - Udiff/2$$

applies for the line driver 56 in a push-pull output stage.

The following equation results for the ohmic resistance of the PTC resistor 50 for the line circuit 14 shown in FIG. 1:

$$R(PTC) = (Um - Utr)/I.$$

The above voltage equation for the voltage Utr of the line driver 54, results in:

$$R(PTC) = (Um - U(equal) - Udiff/2)/I.$$

Thus the ohmic resistance R(PTC) of the resistor 50 cannot be determined if the voltage U(equal) is not known. The differential ohmic resistance of the PTC resistor 50 can, however, be determined if—with the aid of the line driver 54 —two different voltages are output, and two different voltages and two different currents are measured. The differential resistance Rdiff(PTC) results from the differential quotients of the two voltages and the two currents:

$$Rdiff(PTC) = \Delta U/\Delta I = (U1 - U2)/(I1 - I2).$$

In the exemplary embodiment the voltage U1 is selected as being greater than the voltage U2. The following applies for the voltage U1 over the PTC resistor 50 in the first measurement:

$$U1 = Um1 - Utr1.$$

The following applies for the voltage U2 over the PTC resistor 50 in the second measurement:

$$U2 = Um2 - Utr2.$$

Using the above formula for the differential resistance Rdiff(PTC), the following applies:

$$Rdiff(PTC) = (Um1 - Utr1 - Um2 + Utr2)/(I1 - I2),$$

wherein I1 is the flow of current detected in the first measurement and I2 is the flow of current detected in the second measurement of the current I, i.e. of the current flowing through the resistor 50.

Using the above equation for Utr gives the following result:

$$Rdiff(PTC) = (Um1 - Um2 - Udiff1/2 + Udiff2/2)/(I1 - I2).$$

This result is independent of the voltage U(equal). The voltages Udiff1 and Udiff2 are known because corresponding input voltages are applied to the inputs of the line drivers 54, 56 with the aid of the control unit 60. For example, the voltage amplification A of the push-pull output stage with the line drivers 54 and 56 equals 60. In this case, in order to generate a differential voltage Udiff1 of—for example —10 volts, a voltage differential of −0.166 volts is applied to the inputs of the line drivers 54, 56. To generate a voltage Udiff2 for the second measurement of—for example—+10 volts, a voltage of +0.166 volts is applied as the difference between the inputs of the line drivers 54, 56. The result for Rdiff(PTC) is thus independent of the voltage U(equal) and is also independent of the voltages Utr.

In another exemplary embodiment the differential resistance Rdiff(PTC) is also carried out, according to the method determined above, for a subscriber circuit, wherein a simple output amplifier stage, and not a push-pull stage, is used. This means that there is no line driver 56—see dashed line illustration in FIG. 1.

In a further exemplary embodiment only the sign of Rdiff (PTC) is determined, in which case a measurement voltage Um does not need to be detected. This is possible because the resistance R(PTC) is usually significantly greater than the internal resistance Ri of the external voltage source, for example at least by a factor of 10 or at least by a factor of 100. This is because the PTC resistor 50 only becomes high-resistance in the case of a high voltage and thus if the value of Ri is low. In this exemplary embodiment, for example, the voltage Udiff is changed in the positive direction. This causes the voltage over the PTC resistor 50 to move in the negative direction. If the PTC resistor 50 is low-resistance, then the current also changes in the negative direction. If, however, the PTC resistor 50 is high-resistance, then the current changes in the positive direction because of the negative differential resistance of the PTC resistor 50.

In further exemplary embodiments with detection of the measurement voltage Um or without detection of the measurement voltage Um the voltage Udiff1 is not specified, so that the value of the voltage Udiff1 equals 0 volts.

FIG. 2 uses a coordinates system 89 to show the characteristic curve of the PTC resistor 50 in thermal equilibrium. The voltage Ur over the PTC resistor 50 is shown on an x-axis 90 of the coordinates system 89, for example in a range from −150 volts to +150 volts. The current I through the PTC resistor 50 is shown on a y-axis 92 of the coordinates system 89, for example in a range from −100 milliamperes to +100 milliamperes. A characteristic curve 94 of the PTC resistor runs as follows:

in a voltage range B1 of −150 volts to −10 volts (for example) the current I has a negative sign and increases in proportion as the voltage decreases, first slowly and then more quickly;

however, in a voltage range B2 of, for example, −10 volts to +10 volts, the current I increases in a linear fashion as the voltage U increases, in a range B3 of, for example, +10 volts to +150 volts, the current I falls from a high current value (so-called breakover current), as the voltage U increases, to a low positive current value, wherein the reduction is fast initially and then proceeds increasingly slowly.

FIG. 3 shows the method steps that are carried out in order to determine the state of the PTC resistor 50. The method starts with a method step 100.

In chronological sequence following the method step 100, in a method step 102 a voltage Ue1 is applied by the control unit to the input of the line driver 54, in order to generate the requisite voltage Udiff1. In a subsequent method step 104 the voltage Um1 and the current Im1 is detected with the aid of the evaluation unit 58.

In a subsequent method step 106 a voltage Ue2 is applied to the input of the line driver 54 with the aid of the control unit 60, in order to generate the voltage Udiff2. If voltage Ue2 is still present the measurement voltage Um2 and the measurement current Im2 is detected with the aid of the evaluation unit 58.

In a method step 110 the sign for the differential resistance Rdiff(PTC) is then determined by the evaluation unit 58 according to the above formulae. In a method step 112, the evaluation unit 58 ascertains whether the sign is positive. If so, then in a method step 114, which immediately follows the method step 112, it is noted that the PTC resistance 50 is in the linear range B2, i.e. in the low-resistance range. For example, a piece of data is stored that has the value 0. Alternatively a signal with a small voltage value, e.g. 0 volts, is output on the output line 88 of the evaluation unit 58.

However, if it is ascertained, in the method step 112, that the sign is negative, then the method step 112 is immediately followed by a method step 116 in which it is noted that the PTC resistance is in the range B3, i.e. in the high-resistance range. For example, a piece of data with the value 1 is stored or a signal with a high voltage value, e.g. the voltage value 5 volts, is output on the output line 88.

Both the method step 114 and the method step 116 are followed by a method step 118, in which further measurements are carried out on the two-wire line or on the telephone 18 of the subscriber TlnA from the line circuit 14. In this case the value stored in the method step 114 or in the method step 116 is taken into account. After the measurements have been carried out the process ends with a method step 120. Alternatively the further measurements are carried out even before the differential resistance is determined or before the sign of the differential resistance is determined.

In an alternative exemplary embodiment, the value of the differential resistance Rdiff(PTC) is determined in addition in the method step 110 with the aid of the above formula. In this case the determined value of the differential resistance Rdiff(PTC) is additionally stored in the method steps 114 and 116.

The sign of Rdiff(PTC) is determined in a different exemplary embodiment without the measurement voltages Um1 or Um2 being detected according to the method specified above.

In alternative exemplary embodiments the voltage is not modified by the PTC resistor 50, but by the current flowing through this PTC resistor 50.

The invention may, for example, be used in exchanges of a through-connected telecommunications network, for example in an exchange from the company Siemens AG of the type EWSD (digital electronic switching system). In voice and IVD modules in particular (Integrated Voice over Data, i.e. the simultaneous transmission of analog voice signals and digital data over one line), line measurements are carried out by the line ports themselves so that additional equipment is no longer necessary. Other examples of application are modules from the company Siemens AG of the type FastLink or HiX.

The invention claimed is:

1. A circuit arrangement to detect a state of a circuit-protection element, comprising:
    the circuit-protection element having a resistance, wherein the resistance depends on the voltage on the protection element, wherein in a first voltage range a flow of current and a voltage change are in synchronism to one another, and, in a second voltage range the flow of current and voltage change in opposite directions to one another;
    a detection unit to detect at least one potential or one voltage on the protection element, or to detect a current flowing through the protection element;
    a specification unit to make a potential modification or a voltage modification on the protection element, or to make a modification to the current through the protection element; and
    an evaluation unit connected on an input side to an output of the detection unit, wherein the evaluation unit generates an evaluation output based upon an output of the detection unit, and based upon at least one modification initiated by the specification unit, and wherein the generated output signal specifies a opposite sign or a same sign of the voltage and the current on the protection element.

2. The circuit arrangement as claimed in claim 1, wherein the circuit arrangement has a connection unit to connect a line.

3. The circuit arrangement as claimed in claim 2, wherein the line has a length selected from the group consisting of: a length more than 50 meters and a length more than 500 meters.

4. The circuit arrangement as claimed in claim 2, wherein a subscriber terminal of a telecommunications network is connected to the line.

5. The circuit arrangement as claimed in claim 1, wherein the detection unit has at least a part of a line driver for a voltage amplification.

6. The circuit arrangement as claimed in claim 5, wherein the line driver has a function based upon a push-pull principle.

7. The circuit arrangement as claimed in claim 1, wherein the specification unit has at least a part of a line driver for a voltage amplification.

8. The circuit arrangement as claimed in claim 7, wherein the function of the line driver is based upon a push-pull principle.

9. The circuit arrangement as claimed in claim 1, wherein the specification unit uses at least two modifications for a detection.

10. The circuit arrangement as claimed in claim 1, wherein the detection unit has a voltage detection unit and a current detection unit, wherein the specification unit has a voltage specification unit, wherein the evaluation unit is connected on an input side to an output of the voltage detection unit and to an output of the current detection unit, and wherein the evaluation unit generates an output based upon an output of the voltage detection unit, and based upon an output of the current detection unit for two different voltages or potentials on the protection element, wherein the output of the evaluation unit specifies the sign of the differential resistance of the protection element.

11. The circuit arrangement as claimed in claim 10, wherein the output of the evaluation unit specifies an amount of the differential resistance.

12. The circuit arrangement as claimed in claim 10, wherein the voltage detection unit detects the voltage on a terminal of the protection element to ground.

13. The circuit arrangement as claimed in claim 1, wherein the protection element is a PTC resistor.

14. The circuit arrangement as claimed in claim 1, wherein the protection element is a safety element with a carbon-filled polymer.

15. The circuit arrangement as claimed in claim 1, wherein a control unit connected on a output side to the specification unit and to the evaluation unit.

16. The circuit arrangement as claimed in claim 15, wherein the circuit arrangement is a part of a telecommunication net.

17. A method for detecting a state of a protection element, comprising:

detecting a first current flow through the protection element with a first voltage on the protection element;
modifying the voltage on the protection element;
detecting a second current flow through the protection element based upon the modified voltage; and
determining the change between the currents.

18. The method as claimed in claim 17, wherein a direction of the change of the current is determined, and wherein a signal is generated specifying the direction of the change.

19. A method for detecting the state of a protection element, comprising:

detecting a first voltage on the protection element with a first current through the protection element;
modifying the first current; and
detecting of a second voltage on the protection element based upon the modified current;
determining the change of the voltage.

20. The method as claimed in claim 19, wherein a direction of the change of the current is determined, and wherein a signal is generated specifying the direction.

* * * * *